US009064136B1

(12) United States Patent
Ni et al.

(10) Patent No.: US 9,064,136 B1
(45) Date of Patent: Jun. 23, 2015

(54) ACCURATE RECONSTRUCTION OF FREQUENCY-SPARSE SIGNALS WITH ARBITRARY FREQUENCIES FROM NON-UNIFORM SAMPLES

(71) Applicant: HRL Laboratories, LLC, Malibu, CA (US)

(72) Inventors: Kang-Yu Ni, Calabasas, CA (US); Cathy (Xiangming) Kong, Newbury Park, CA (US); Roy M. Matic, Newbury Park, CA (US); Mohiuddin Ahmed, Moorpark, CA (US)

(73) Assignee: HRL Laboratories, LLC, Malibu, CA (US)

( * ) Notice: Subject to any disclaimer, the term of this patent is extended or adjusted under 35 U.S.C. 154(b) by 331 days.

(21) Appl. No.: 13/749,610

(22) Filed: Jan. 24, 2013

Related U.S. Application Data

(60) Provisional application No. 61/590,394, filed on Jan. 25, 2012.

(51) Int. Cl.
| | |
|---|---|
| *G06G 7/16* | (2006.01) |
| *G06G 7/32* | (2006.01) |
| *G06G 7/122* | (2006.01) |
| *G06G 7/161* | (2006.01) |

(52) U.S. Cl.
CPC .............. *G06G 7/32* (2013.01); *G06G 7/122* (2013.01); *G06G 7/161* (2013.01)

(58) Field of Classification Search
CPC ............ G06G 7/26; G06G 7/28; G06G 7/22; G06G 7/20; G06J 1/00
USPC ......................................................... 708/845
See application file for complete search history.

(56) References Cited

U.S. PATENT DOCUMENTS

2012/0170767 A1* 7/2012 Astrom et al. .................. 381/77
2013/0151924 A1* 6/2013 Beadle et al. ................. 714/763

OTHER PUBLICATIONS

E. Candes and T. Tao. Near optimal signal recovery from random projection: universal encoding strategies? IEEE Trans. on information Theory, 52 540-5425, 2006.

D. L. Domino, Compressed sensing. IEEE Trans. on Information Theory. 52:1289-1306, 2006.

Marco F. Duarte and Richard G. Baraniuk. Spectral Compressive Sensing. Preprint submitted to Applied and Computational Harmonic Analysis Aug. 1, 2012.

"LSQR: An algorithm for sparse linear equations and sparse least squares", TOMS 8(1), 43-71, 1982.

Candes E. J., Eldar. Y. C., Needell, D. and Randall, P., "Compressed Sensing with Coherent and Redundant Dictionaries", Appl. Combat. Harm. Anal., 32, 59-73 (2011).

(Continued)

*Primary Examiner* — Tan V. Mai
(74) *Attorney, Agent, or Firm* — Tope-McKay & Associates

(57) ABSTRACT

Described is a method for accurately reconstructing analog signals. The present invention considers a general parameter estimation problem, extends the utility of compressive sensing to real scenarios, and is able to accurately estimate center frequencies and amplitudes. Specifically, an unknown continuous analog signal comprising a set of arbitrary frequencies and amplitudes is received. A set of non-uniform samples of the unknown continuous analog signal is then obtained at multiple times. Finally, an iterative reconstruction process is utilized to determine a set of frequencies and a set of amplitudes that best fit the set of non-uniform samples in a global minimum problem in order to accurately reconstruct the continuous analog signal.

15 Claims, 4 Drawing Sheets

(56) References Cited

OTHER PUBLICATIONS

Eftekhan, A., Romberg, J. and Wakin, M. B. "Matched Filtering from Limited Frequency Samples", arXiv: 1101.2713 (2011).

Fannjiang, A., and Liao, W., "Conherence—Pattern-Guided Compressive Sensing with Unresolved Grids", arXiv:1106.5177 (2011).

Kang-Yu Ni, Xiangming Kong, Roy M Matic, and Mohiuddin Ahmed, Accurate Reconstruction of Frequency-Sparse Signals from Non-Uniform Samples, Proceedings of SPIE 8361, Radar Sensor Technology XVI, 836109, May 2012.

* cited by examiner

ACCURATE RECONSTRUCTION OF FREQUENCY-SPARSE SIGNALS WITH ARBITRARY FREQUENCIES FROM NON-UNIFORM SAMPLES

CROSS-REFERENCE TO RELATED APPLICATIONS

This is a Non-Provisional patent application of U.S. Provisional Application No. 61/590,394, filed in the United States on Jan. 25, 2012, titled, "Accurate Reconstruction of Frequency-Sparse Signals with Arbitrary Frequencies from Non-Uniform Samples."

BACKGROUND OF THE INVENTION (1) Field of Invention

The present invention relates to a system for accurately reconstructing analog signals and, more particularly, to a system for accurately reconstructing analog signals in a continuous sparsifying domain.

(2) Description of Related Art

Compressive sensing is a signal processing technique for efficiently acquiring and reconstructing a signal by finding solutions to underdetermined linear systems. Compressive sensing is able to reconstruct signals with measurements far below the Nyquist rate, under the assumption that the signal is sparse (e.g., the number of frequencies is small). Since the compressive sensing theory is developed from the discrete signal domain, it is limited when dealing with real analog signals with continuous frequency band.

The compressive sensing (CS) theory was set forth by Donoho in "Compressed sensing" in *IEEE Trans. on Information Theory*, 52:1289-1306, 2006 and Candes in "Near optimal signal recovery from random projection: universal encoding strategies?" in *IEEE Trans. on Information Theory*, 52:5406-5425, 2006, which are both hereby incorporated by reference as though fully set forth herein. The CS theory states that it is possible to reconstruct signals with measurements far below the Nyquist rate if the signals are sparse in some known transform domain. There has been a substantial amount of research on refining the theoretical results (especially towards the conditions on measurements matrices), improving the efficiency of reconstruction algorithms, and turning the CS theory into practical applications in a wide range of areas. One application is to measure and reconstruct frequency-sparse signals that occur in communications (i.e., the number of frequencies is small). However, since the formulation of compressive sensing is discrete, it is only able to properly deal with a discrete sparsifying domain (i.e., frequencies on the discretized grid), which is not realistic in practice.

Further, Duane and Baraniuk proposed in "Spectral Compressive Sensing" in *Applied and Computational Harmonic Analysis*, 2012, a suite of spectral CS (SCS) recovery algorithms for arbitrary frequency-sparse signals. This reference, hereinafter referred to as the Duarte and Baraniuk reference, is hereby incorporated by reference as though fully set forth herein. The method described in the Duarte and Baraniuk reference uses an over-sampled discrete Fourier Transform (DFT) frame together with a coherence-inhibiting structured signal model. The method was demonstrated to outperform current state-of-the-art CS algorithms based on the DFT and classical sinusoid parameter estimation algorithms. However, in terms of accuracy of parameter estimation, there is room for improvement.

Thus, a continuing need exists for a method that is able to deal with a continuous sparsifying domain and accurately reconstruct signals with arbitrary frequencies from non-uniform samples with sampling rates much lower than the Nyquist rate.

SUMMARY OF THE INVENTION

The present invention relates to a system for accurately reconstructing analog signals. The system comprises one or more processors and a memory having instructions such that when the instructions are executed, the one or more processors perform multiple operations. First, an unknown continuous analog signal is received comprising a set of arbitrary frequencies and a set of arbitrary amplitudes. A set of non-uniform samples of the unknown continuous analog signal is obtained at a plurality of times. An iterative reconstruction process is then utilized to determine a set of frequencies and a set of amplitudes that best fit the set of non-uniform samples in a global minimum problem in order to accurately reconstruct the continuous analog signal.

In another aspect, in an initial step of the reconstruction process, compressive sensing is applied to compute approximations of the set of frequencies and the set of amplitudes; and in a subsequent step of the reconstruction process, the approximations of the set of frequencies and the set of amplitudes are used to find the minimizations of the set of frequencies and the set of amplitudes.

In another aspect, the continuous analog signal, y, is a linear combination of k tones:

$$y(t) = \sum_{l=1}^{k} a_l e^{i2\pi f_l t},$$

where $f_l \in [0, N]$, $a_l \in \mathbb{R}$, for $t \in \mathbb{R}$, where $f_l$ denotes an $l^{th}$ frequency, $\alpha_l$ denotes an $l^{th}$ amplitude, t denotes time, N denotes an integer number, $\mathbb{R}$ denotes the set of real numbers, $\Sigma$ denotes a summation, $\in$ denotes "is an element of", and $e^{i2\pi f_l t}$ denotes a pure tone; wherein the set of non-uniform samples is $y_1 = y(t_1), y_2 = y(t_2), \ldots, y_M = y(t_M)$, where M<N; and wherein the global minimum problem is:

$$\min_{\substack{f_1, f_2, \ldots, f_k \in [0,N] \\ a_1, a_2, \ldots, a_k \in \mathbb{R}}} \sum_{j=1}^{M} \left\| y_j - \sum_{l=1}^{k} a_l e^{i2\pi f_l t_j} \right\|_2^2,$$

where $\|\ldots\|_2$ denotes "the $L_2$ norm of", and M denotes an integer.

In another aspect, $t_1, t_2, \ldots, t_M$ $$\in \left\{ 0, \frac{1}{N}, \frac{2}{N}, \ldots, \frac{N-1}{N} \right\}.$$

A matrix $\Phi = DF$ is defined, where F is an inverse Fourier matrix and D is a diagonal matrix associated with selection of $t_1, t_2, \ldots, t_M$. A diagonal of the matrix $\Phi$ is defined by d(j)=1 if j=$t_i$N for some i and d(j)=0 otherwise. A set of non-uniform samples $\vec{y}=(y_1, y_2, \ldots, y_M)$ is approximated by $\vec{y} \approx \Phi \vec{x}$, where $\vec{x}=(x_1, x_2, \ldots, x_N)$ with $x_j=\alpha_i$ if j=round($f_i$) for some i and $x_j=0$ otherwise. A convex optimization problem having a solution $\vec{x}^*$ is computed according to the following:

$$\vec{x}^* = \mathrm{argmin}_{\vec{x}} \|\vec{y} - \Phi\vec{x}\|_2^2 + \lambda\|\vec{x}\|_1,$$

where $\lambda > 0$ is a tuning parameter.

In another aspect, a set of indices, I, of k' largest absolute values of $\vec{x}^* = (x^*_1, x^*_2, \ldots, x^*_N)$ is identified, where $\vec{\alpha}^* = \vec{x}^*(I)$ and $\vec{f}^* = I$. A minimization with respect to $\vec{f}$ is computed according to the following:

$$\min_{f_1, f_2, \ldots, f_{k'} \in [0,N]} \sum_{j=1}^{M} \left\| y_j - \sum_{l=1}^{k'} a_l e^{i2\pi f_l t_j} \right\|_2^2.$$

A minimization with respect to $\vec{\alpha}$ is computed according to the following:

$$\min_{a_1, a_2, \ldots, a_{k'} \in \mathbb{R}} \sum_{j=1}^{M} \left\| y_j - \sum_{l=1}^{k'} a_l e^{i2\pi f_l t_j} \right\|_2^2.$$

As can be appreciated by one in the art, the present invention also comprises a method for causing a processor to perform the operations described herein.

Finally, the present invention also comprises a computer program product comprising computer-readable instruction means stored on a non-transitory computer-readable medium that are executable by a computer having a processor for causing the processor to perform the operations described herein.

BRIEF DESCRIPTION OF THE DRAWINGS

The objects, features and advantages of the present invention will be apparent from the following detailed descriptions of the various aspects of the invention in conjunction with reference to the following drawings, where.

DETAILED DESCRIPTION

Figure 1:
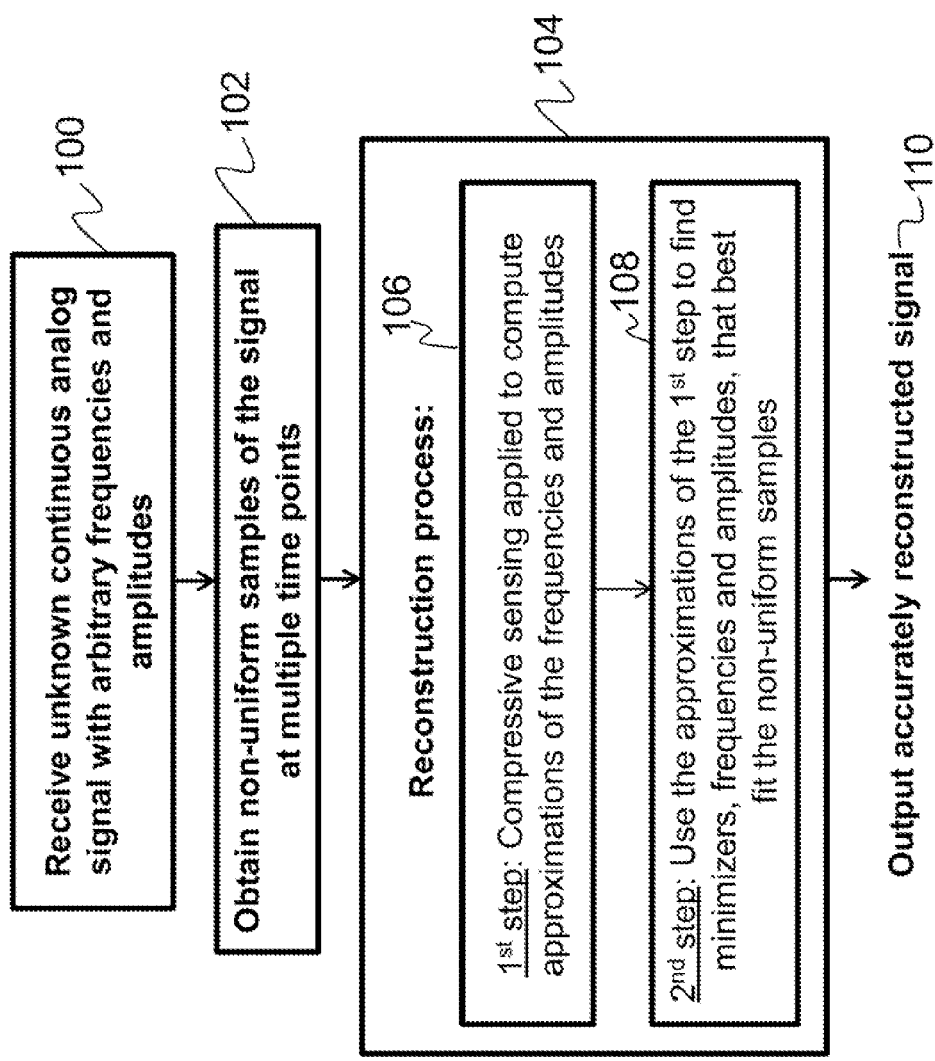
FIG. 1 is a diagram of a method for accurately reconstructing analog signals according to the present invention.

The present invention relates to a system for accurately reconstructing analog signals and, more particularly, to a system for accurately reconstructing analog signals in a continuous sparsifying domain. The following description is presented to enable one of ordinary skill in the art to make and use the invention and to incorporate it in the context of particular applications. Various modifications, as well as a variety of uses, in different applications will be readily apparent to those skilled in the art, and the general principles defined herein may be applied to a wide range of embodiments. Thus, the present invention is not intended to be limited to the embodiments presented, but is to be accorded with the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Please note, if used, the labels left, right, front, back, top, bottom, forward, reverse, clockwise and counter-clockwise have been used for convenience purposes only and are not intended to imply any particular fixed direction. Instead, they are used to reflect relative locations and/or directions between various portions of an object. As such, as the present invention is changed, the above labels may change their orientation.

(1) Principal Aspects

The present invention has three "principal" aspects. The first is a system for accurately reconstructing analog signals. The system is typically in the form of a computer system, computer component, or computer network operating software or in the form of a "hard-coded" instruction set. This system may take a variety of forms with a variety of hardware devices and may include computer networks, handheld computing devices, cellular networks, satellite networks, and other communication devices. As can be appreciated by one skilled in the art, this system may be incorporated into a wide variety of devices that provide different functionalities. The second principal aspect is a method for accurately reconstructing analog signals. The third principal aspect is a computer program product. The computer program product generally represents computer-readable instruction means (instructions) stored on a non-transitory computer-readable medium such as an optical storage device, e.g., a compact disc (CD) or digital versatile disc (DVD), or a magnetic storage device such as a floppy disk or magnetic tape. Other, non-limiting examples of computer-readable media include hard disks, read-only memory (ROM), and flash-type memories.

The term "instructions" as used with respect to this invention generally indicates a set of operations to be performed on a computer, and may represent pieces of a whole program or individual, separable, software modules. Non-limiting examples of "instructions" include computer program code (source or object code) and "hard-coded" electronics (i.e., computer operations coded into a computer chip). The "instructions" may be stored on any non-transitory computer-readable medium such as a floppy disk, a CD-ROM, a flash drive, and in the memory of a computer.

(2) Specific Details

The invention described herein presents a scheme for sampling and reconstructing analog signals. Compressive sensing is able to reconstruct signals with measurements far below the Nyquist rate, under the assumption that the signal is sparse. However, since the formulation of compressive sensing is discrete, it is only able to deal with a discrete sparsifying domain (i.e., frequencies on the grid), which is not a realistic assumption. The present invention comprises a method for dealing with a continuous sparsifying domain by extending the utility of compressive sensing. Specifically, the present invention considers a general parameter estimation problem, extends the utility of compressive sensing to real scenarios, and is able to accurately estimate center frequencies and amplitudes. Since the problem considered is very general, the invention is widely applicable to a variety of problems in communications.

FIG. 1 is a flow diagram summarizing the method for accurately reconstructing analog signals according to the present invention. In a first step 100, an unknown continuous analog signal comprising a set of arbitrary frequencies and a set of arbitrary amplitudes is received by the system. In a second step 102, non-uniform samples of the unknown continuous analog signal are obtained at multiple time points. In a third step 104, a reconstruction process is performed. In a first step of the reconstruction process 106, compressive sensing is applied to compute approximations of the frequencies and amplitudes. In a second step of the reconstruction process 108, the approximations computed in the first step of the reconstruction process 106 are used to find the minimizations of the frequencies and amplitudes, which are a best fit to the non-uniform samples. In a final step 110, an accurately reconstructed signal is output. The derivation of the present invention is described in detail below.

(2.1) Approach

In considering a continuous sparsifying domain, assume a signal of interest, y, is a linear combination of k tones:

$$y(t) = \sum_{l=1}^{k} a_l e^{i2\pi f_l t}, \quad (1)$$

where $f_l \in [0, N]$, $a_l \in \mathbb{R}$, for $t \in \mathbb{R}$.

where $f_l$ denotes the $l^{th}$ frequency, $\alpha_l$ denotes the $l^{th}$ amplitude, t denotes time, N denotes an integer number, $\mathbb{R}$ denotes the set of real numbers, $\Sigma$ denotes a summation, $\in$ denotes "is an element of", and $e^{i2\pi f_l t}$ denotes a pure tone. The goal is to be able to accurately reconstruct the above continuous signal from under-sampled measurements. This can be achieved by estimating the frequencies and amplitudes, $f_l$ and $\alpha_l$, and taking direct non-uniform samples at time $t_1, t_2, \ldots, t_M$, with M<N. Since there are only finitely many samples, without loss of generality, it is hereinafter assumed that $0 \leq t_1 < t_2 < \ldots < t_M \leq 1$. Therefore, there are samples:

$$y_1 = y(t_1), y_2 = y(t_2), \ldots, y_M = y(t_M), \quad (2)$$

where $\|\ldots\|_2$ denotes "the $L_2$ norm".

Given such samples and the assumption of the signal in equation (1), an intuitive way to solve the signal is to directly look for frequencies and amplitudes that best fit the samples in the least-squares sense according to the following:

$$\min_{\substack{f_1, f_2, \ldots, f_k \in [0, N] \\ a_1, a_2, \ldots, a_k \in \mathbb{R}}} \sum_{j=1}^{M} \left\| y_j - \sum_{l=1}^{k} a_l e^{i2\pi f_l t_j} \right\|_2^2. \quad (3)$$

The above problem is convex with respect to $\vec{\alpha} = (\alpha_1, \alpha_2, \ldots, \alpha_k)$, but highly non-convex with respect to $\vec{f} = (f_1, f_2, \ldots, f_k)$. Thus, the problem is convex locally. A remedy to the problem is presented below.

(2.2) Local Convexity

To show that equation (3) is locally convex with respect to $\vec{f}$ for fixed $\vec{\alpha}$, let $$S(\vec{f}) = \sum_{j=1}^{M} \left\| y_j - \sum_{l=1}^{k} a_l e^{i2\pi f_l t_j} \right\|_2^2 = \quad (4)$$

$$\sum_{j=1}^{M} \left\{ \left[ \operatorname{re}(y_j) - \sum_{l=1}^{k} a_l \cos(2\pi f_l t_j) \right]^2 + \left[ \operatorname{im}(y_j) - \sum_{l=1}^{k} a_l \sin(2\pi f_l t_j) \right]^2 \right\},$$

where re denotes the real part of a complex number and im denotes the imaginary part of a complex number.

Then, its gradient is:

$$\nabla S(\vec{f}) = \quad (5)$$

$$4\pi \sum_{j=1}^{M} (a_1 t_j [A_j \sin(2\pi f_1 t_j) - B_j \cos 2\pi f_1 t_j, a_2 t_j A_j \sin 2\pi f_2 t_j - $$

$$B_j \cos 2\pi f_2 t_j, \ldots, a_k t_j A \sin 2\pi f_k t_j - B_j \cos 2\pi f_1 t_j,$$

where $$A_j = \operatorname{re}(y_j) - \sum_{l=1}^{k} a_l \cos(2\pi f_l t_j) \text{ and } B_j = \operatorname{im}(y_j) - \sum_{l=1}^{k} a_l \sin(2\pi f_l t_j).$$

The entries of its Hessian, $HS(\vec{f})$, are:

$$H_{ii} = 8\pi \sum_{j=1}^{M} a_i t_j [A_j \cos(2\pi f_i t_j) + B_j \sin(2\pi f_i t_j)]$$

on the diagonal (5) and $$H_{im} = 8\pi \sum_{j=1}^{M} a_m a_i t_j^2 \cos(2\pi t_j (f_m - f_i)) \quad (6)$$

for $i \neq m$.

In the following it is shown that that in the case of one dimension (k=1), the second derivative is positive on a small interval. In the case of higher dimensions, one needs to show that the Hessian is positive-definite. In the one-dimensional case, let $y(t) = a_0 e^{i2\pi f_0 t}$ and $s(f) = \|y(t) - ae^{i2\pi f t}\|_2^2 =$
$[a_0\cos(2\pi f_0 t) - a\cos(2\pi f t)]^2 + [a_0\sin(2\pi f_0 t) - a\sin(2\pi f t)]^2.$ Then, one can derive that $$S''(f) = 8\pi a_0 a t^2 \cos(2\pi t(f - f_0)). \tag{7}$$

Equation (8) is positive if $|f-f_0| \leq 0.25$ for $t \in [0,1]$. Therefore, the one-dimensional case of $S(\vec{f})$ in equation (4) is convex for $t \in [0,1]$ over the set $\{f: |f-f_0| \leq 0.25\}$.

As a result, initializations for equation (3) within such sets are then sufficient to obtain a global minimum solution via an optimization process, instead of getting stuck at a local minimum with arbitrary initializations. Presented below is a 2-step greedy reconstruction process that iteratively finds a good initialization in an initial (first) step and refines the solution in a subsequent (second) step.

(2.3) Reconstruction Process

In a first step of the reconstruction process of the present invention, compressive sensing is applied to find a good approximation. To be able to utilize compressive sensing, assume the non-uniform samples are taken on the grid $$\left(\text{i.e. } t_1, t_2, \ldots, t_M \in \left\{0, \frac{1}{N}, \frac{2}{N}, \ldots, \frac{N-1}{N}\right\}\right).$$

Then, one can define the corresponding matrix $\Phi=DF$, where F is the inverse Fourier matrix and D is the diagonal matrix associated with the selection of $t_1, t_2, \ldots, t_M$, and its diagonal is defined by $d(j)=1$ if $j=t_i N$ for some i and $d(j)=0$ otherwise. Thus, the non-uniform samples $\vec{y}=(y_1, y_2, \ldots, y_M)$ can be approximated by $\vec{y} \approx \Phi \vec{x}$, where $\vec{x}=(x_1, x_2, \ldots, x_N)$ with $x_j=\alpha_i$ if $j=\text{round}(f_i)$ for some i and $x_j=0$ otherwise, where round denotes rounding the number to the closest integer. To avoid complexity, N is assumed to be large enough so that each round($f_i$) takes a unique value. Therefore, the problem of finding an approximation to equation (3) was turned into a compressive sensing problem, in which the sparsity constraint on $\vec{x}$ is carried out by the following convex optimization problem:

$$\vec{x}^* = \text{argmin}_{\vec{x}} \|\vec{y} - \Phi \vec{x}\|_2^2 + \lambda \|\vec{x}\|_1, \tag{8}$$

where $\lambda > 0$ is a parameter which tunes the balance between the two terms, $\vec{y}$ and $\Phi \vec{x}$. The solution $\vec{x}^*$ gives approximations to $\vec{\alpha}$ and $\vec{f}$ by thresholding: find the set of indices, I, of k' largest absolute values of $\vec{x}^*=(x^*_1, x^*_2, \ldots, x^*_N)$; then let $\vec{\alpha}^*=\vec{x}^*(I)$ and $\vec{f}^*=I$. Note that $\vec{f}^*$ is on the grid (i.e., $\vec{f}^* \in \{0, 1, 2, \ldots, N-1\}^k$) and its components are closest to the actual frequencies, components of $\vec{f}$.

In the second step of the reconstruction process of the present invention, to solve equation (3) from the initializations obtained in the first step described above, one can minimize with respect to $\vec{f}$ and $\vec{\alpha}$, alternatively:

$$\min_{f_1, f_2, \ldots, f_{k'} \in [0,N]} \sum_{j=1}^{M} \left\| y_j - \sum_{l=1}^{k'} a_l e^{i2\pi f_l t_j} \right\|_2^2 \tag{9}$$

and $$\min_{a_1, a_2, \ldots, a_{k'} \in \mathbb{R}} \sum_{j=1}^{M} \left\| y_j - \sum_{l=1}^{k'} a_l e^{i2\pi f_l t_j} \right\|_2^2. \tag{10}$$

Newton's method is applied to solve equation (10):

$$\vec{f}_{n+1} = \vec{f}_n - [HS(\vec{f}_n)]^{-1} \nabla S(\vec{f}_n), \tag{11}$$

for $n = 0, 1, 2, \ldots,$ where $HS(\vec{f})$ and $\nabla S(\vec{f})$ are calculated above in equations (5)-(7). Equation (11) is solved by the LSQR algorithm, which is described in "LSQR: An algorithm for sparse linear equations and sparse least squares", *TOMS* 8(1), 43-71, 1982. The reconstruction process of the present invention is summarized below:

Inputs: $\vec{y}=(y_1, y_2, \ldots, y_M)$ and $0 \leq t_1 < t_2 < \ldots < t_M \leq 1$
Outputs: $\vec{f}=(f_1, f_2, \ldots, f_k)$ with each $f_i \in [0, N]$ and $\vec{\alpha}=(\alpha_1, \alpha_2, \ldots, \alpha_k)$
for k'=1, 2, ..., k 1. $\vec{x}^* = \text{argmin}_{\vec{x}} \|\vec{y} - \Phi\vec{x}\|_2^2 + \lambda\|\vec{x}\|_1$ by convex optimization
2. Find and let I be the indices of k' largest absolute values of $$\vec{x}^* = (x^*_1, x^*_2, \ldots, x^*_N).$$

Then, let $$\vec{a}^* = \vec{x}^*(I) \text{ and } \vec{f}_0 = I.$$

for n=0, 1, 2, . . .

1. $\vec{f}_{n+1} = \vec{f}_n - [HS(\vec{f}_n)]^{-1} \nabla S(\vec{f}_n),$

2. $\vec{a}^* = \text{argmin}_{a_1, a_2, \ldots, a_{k'} \in \mathbb{R}} \sum_{j=1}^{M} \left\| y_j - \sum_{l=1}^{k'} a_l e^{i2\pi f_l t_j} \right\|_2^2$ by LSQR algorithm
end
end (2.4) Experimental Results For experimental studies, the parameters were chosen to be the same as those described in the Duarte and Baraniuk reference for the purpose of comparison. More specifically, k=20 arbitrary frequencies were selected from the interval [0, N] with N=1024, where each pair of frequencies were spaced by 5. The amplitudes are all equal to one, and M=300 non-uniform random samples were chosen. The method of the present invention was compared with spectral compressive sensing spectral iterative hard thresholding (SIHT) via Root MUSIC, as described in the Duarte and Baraniuk reference, in which M=300 random measurements were taken (i.e. $\vec{y}=\Psi\vec{x}$, where $\Psi$ is a 300×1024 random Gaussian matrix). MATLAB code was provided by the Duane and Baraniuk reference.

Figure 2:
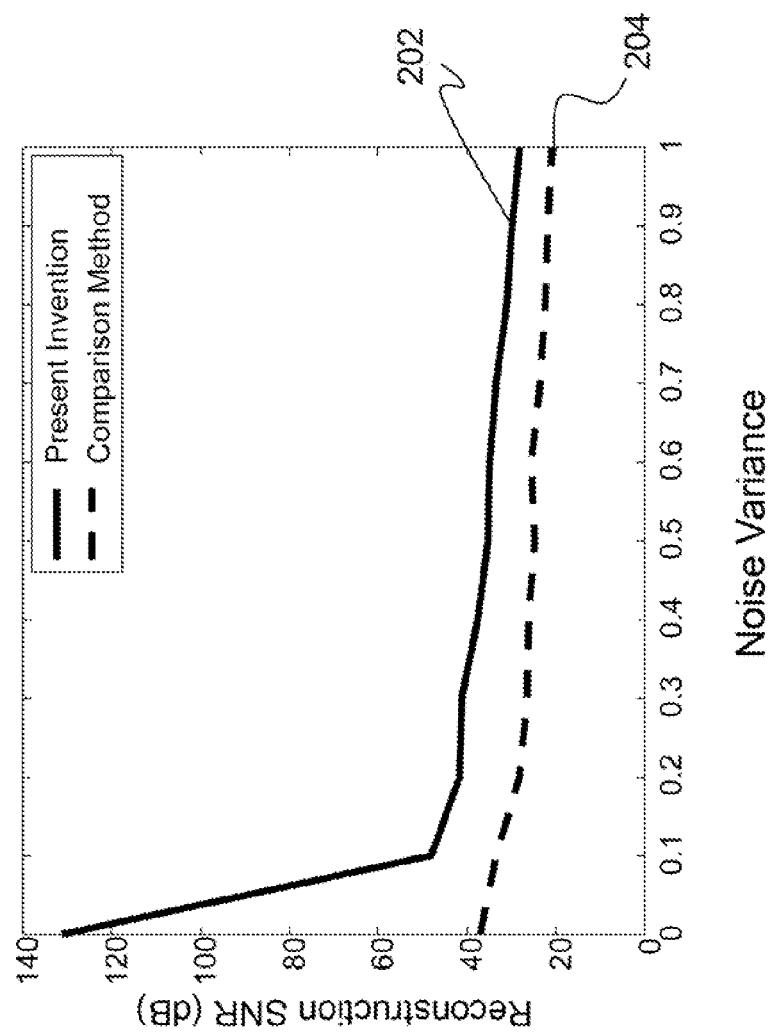
FIG. 2 is a graph depicting reconstructed signal-to-noise ratios (SNR) results from a comparison study according to the present invention.

FIG. 2 is a graph 200 illustrating the average of reconstructed signal-to-noise ratio (SNR) (in decibels (dB)) from 20 independent tests with various levels of noise. Gaussian noise with variance $\sigma$ from 0 to 1, with an increment of 0.1, was added to the measurements: $\vec{y}_{noisy}=\vec{y}+\vec{n}$. The curves are the reconstruction SNR versus the noise variance. It was observed that the present invention (represented by solid curve 202) greatly outperformed the comparison method (represented by dashed curve 204) described above in reconstruction fidelity, as indicated by the higher SNRs.

Figure 3:
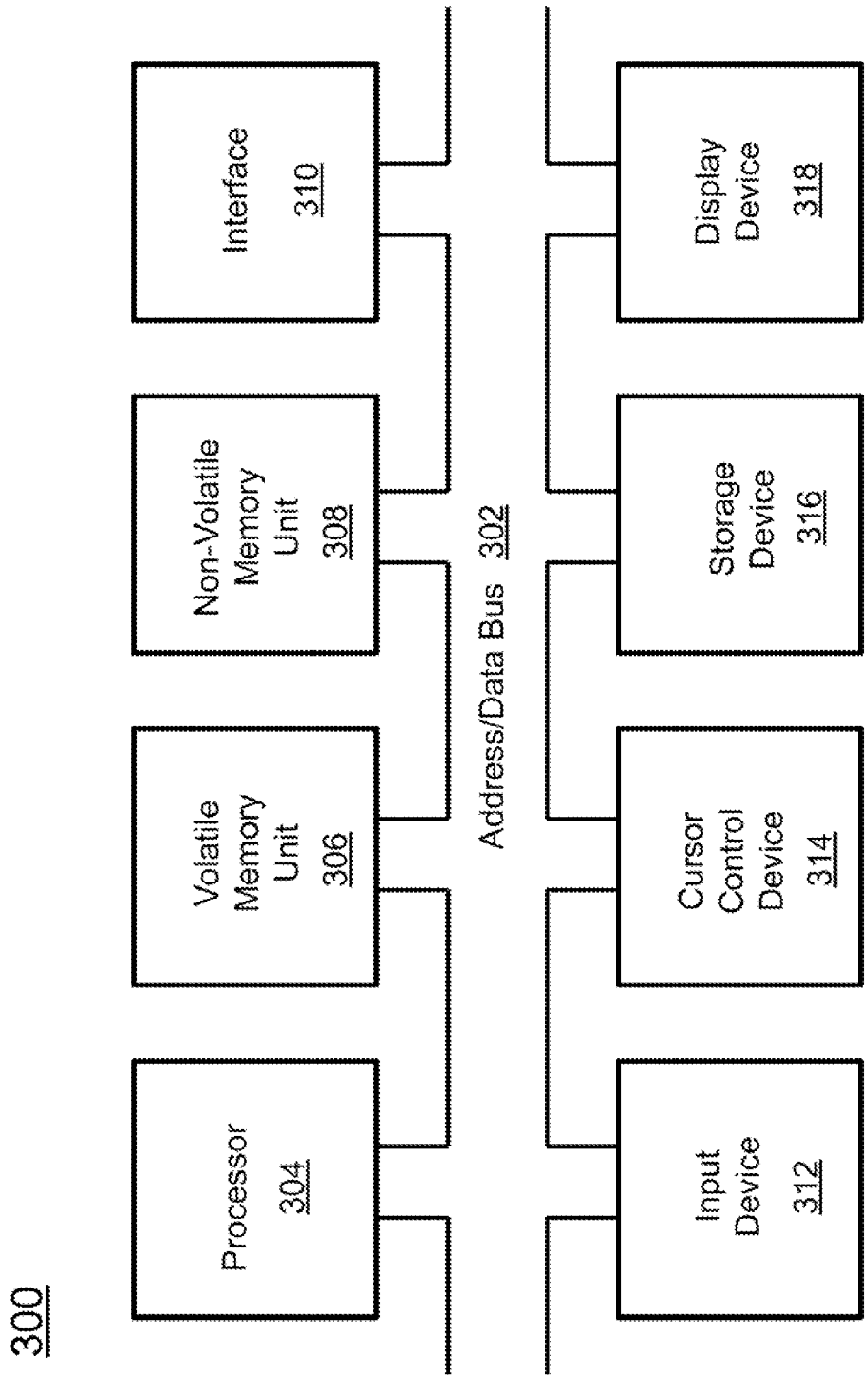
FIG. 3 is an illustration of a data processing system according to the present invention.

An example of a computer system 300 in accordance with one aspect is shown in FIG. 3. The computer system 300 is configured to perform calculations, processes, operations, and/or functions associated with a program or algorithm. In one aspect, certain processes and steps discussed herein are realized as a series of instructions (e.g., software program) that reside within computer readable memory units and are executed by one or more processors of the computer system 300. When executed, the instructions cause the computer system 300 to perform specific actions and exhibit specific behavior, such as described herein.

The computer system 300 may include an address/data bus 302 that is configured to communicate information. Additionally, one or more data processing units, such as a processor 304, are coupled with the address/data bus 302. The processor 304 is configured to process information and instructions. In one aspect, the processor 304 is a microprocessor. Alternatively, the processor 304 may be a different type of processor such as a parallel processor, or a field programmable gate array.

The computer system 300 is configured to utilize one or more data storage units. The computer system 300 may include a volatile memory unit 306 (e.g., random access memory ("RAM"), static RAM, dynamic RAM, etc.) coupled with the address/data bus 302, wherein a volatile memory unit 306 is configured to store information and instructions for the processor 304. The computer system 300 further may include a non-volatile memory unit 308 (e.g., read-only memory ("ROM"), programmable ROM ("PROM"), erasable programmable ROM ("EPROM"), electrically erasable programmable ROM "EEPROM"), flash memory, etc.) coupled with the address/data bus 302, wherein the non-volatile memory unit 308 is configured to store static information and instructions for the processor 304. Alternatively, the computer system 300 may execute instructions retrieved from an online data storage unit such as in "Cloud" computing. In an embodiment, the computer system 300 also may include one or more interfaces, such as an interface 310, coupled with the address/data bus 302. The one or more interfaces are configured to enable the computer system 300 to interface with other electronic devices and computer systems. The communication interfaces implemented by the one or more interfaces may include wireline (e.g., serial cables, modems, network adaptors, etc.) and/or wireless (e.g., wireless modems, wireless network adaptors, etc.) communication technology.

In one aspect, the computer system 300 may include an input device 312 coupled with the address/data bus 302, wherein the input device 312 is configured to communicate information and command selections to the processor 300. In accordance with one aspect, the input device 312 is an alphanumeric input device, such as a keyboard, that may include alphanumeric and/or function keys. Alternatively, the input device 312 may be an input device other than an alphanumeric input device. In one aspect, the computer system 300 may include a cursor control device 314 coupled with the address/data bus 302, wherein the cursor control device 314 is configured to communicate user input information and/or command selections to the processor 300. In one aspect, the cursor control device 314 is implemented using a device such as a mouse, a track-ball, a track-pad, an optical tracking device, or a touch screen. The foregoing notwithstanding, in one aspect, the cursor control device 314 is directed and/or activated via input from the input device 312, such as in response to the use of special keys and key sequence commands associated with the input device 312. In an alternative aspect, the cursor control device 314 is configured to be directed or guided by voice commands.

In one aspect, the computer system 300 further may include one or more optional computer usable data storage devices, such as a storage device 316, coupled with the address/data bus 302. The storage device 316 is configured to store information and/or computer executable instructions. In one aspect, the storage device 316 is a storage device such as a magnetic or optical disk drive (e.g., hard disk drive ("HDD"), floppy diskette, compact disk read only memory ("CD-ROM"), digital versatile disk ("DVD")). Pursuant to one aspect, a display device 318 is coupled with the address/data bus 302, wherein the display device 318 is configured to display video and/or graphics. In one aspect, the display device 318 may include a cathode ray tube ("CRT"), liquid crystal display ("LCD"), field emission display ("FED"), plasma display, or any other display device suitable for displaying video and/or graphic images and alphanumeric characters recognizable to a user.

The computer system 300 presented herein is an example computing environment in accordance with one aspect. However, the non-limiting example of the computer system 300 is not strictly limited to being a computer system. For example, one aspect provides that the computer system 300 represents a type of data processing analysis that may be used in accordance with various aspects described herein. Moreover, other computing systems may also be implemented. Indeed, the spirit and scope of the present technology is not limited to any single data processing environment. Thus, in one aspect, one or more operations of various aspects of the present technology are controlled or implemented using computer-executable instructions, such as program modules, being executed by a computer. In one implementation, such program modules include routines, programs, objects, components and/or data structures that are configured to perform particular tasks or implement particular abstract data types. In addition, one aspect provides that one or more aspects of the present technology are implemented by utilizing one or more distributed computing environments, such as where tasks are performed by remote processing devices that are linked through a communications network, or such as where various program modules are located in both local and remote computer-storage media including memory-storage devices.

Figure 4:
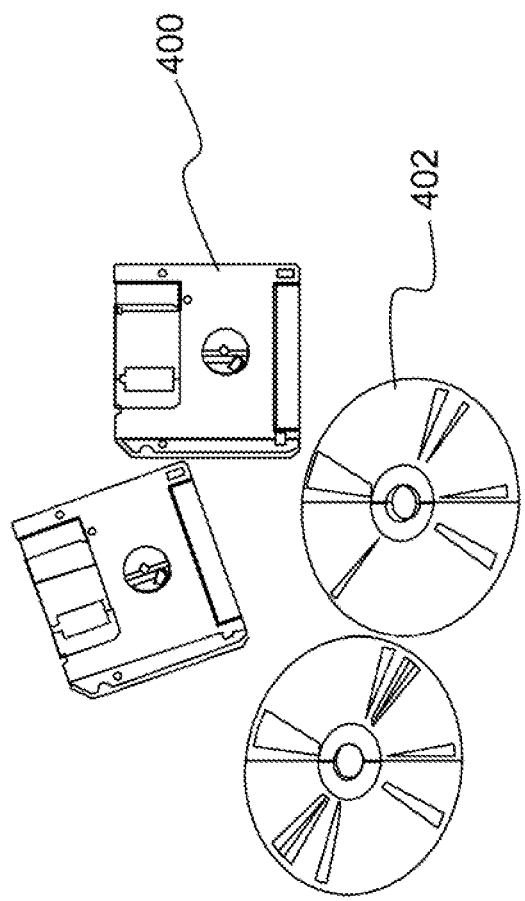
FIG. 4 is an illustration of a computer program product according to the present invention.

An illustrative diagram of a computer program product embodying the present invention is depicted in FIG. 4. As a non-limiting example, the computer program product is depicted as either a floppy disk 400 or an optical disk 402. However, as mentioned previously, the computer program product generally represents computer readable code (i.e., instruction means or instructions) stored on any compatible non-transitory computer readable medium.

What is claimed is:

1. A system for accurately reconstructing analog signals, the system comprising:

one or more processors and a non-transitory memory encoded thereon having instructions such that when the instructions are executed, the one or more processors perform operations of:

receiving an unknown continuous analog signal comprising a set of arbitrary frequencies and a set of arbitrary amplitudes;

obtaining a set of non-uniform samples of the unknown continuous analog signal at a plurality of times; and utilizing an iterative reconstruction process to determine a set of frequencies and a set of amplitudes that best fit the set of non-uniform samples in a global minimum problem in order to accurately reconstruct the continuous analog signal.

2. The system as set forth in claim 1, wherein the one or more processors further perform operations of:

in an initial step of the reconstruction process, applying compressive sensing to compute approximations of a set of frequencies and a set of amplitudes in the set of non-uniform samples; and in a subsequent step of the reconstruction process, using the approximations of the set of frequencies and the set of amplitudes to find the minimizations of the set of frequencies and the set of amplitudes in the set of non-uniform samples.

3. The system as set forth in claim 2, wherein the continuous analog signal, y, is a linear combination of k tones:

$$y(t) = \sum_{l=1}^{k} a_l e^{i2\pi f_l t},$$

where $f_l \in [0, N]$, $a_l \in \mathbb{R}$, for $t \in \mathbb{R}$, where $f_l$ denotes an $l^{th}$ frequency, $\alpha_l$ denotes an $l^{th}$ amplitude, i denotes time, N denotes an integer number, $\mathbb{R}$ denotes the set of real numbers, $\Sigma$ denotes a summation, $\in$ denotes "is an element of", and $e^{i2\pi f_l t}$ denotes a pure tone;

wherein the set of non-uniform samples is $y_1 = y(t_1)$, $y_2 = y(t_2)$, ..., $y_M = y(t_M)$, where M<N; and wherein the global minimum problem is:

$$\min_{\substack{f_1, f_2, \ldots, f_k \in [0, N] \\ a_1, a_2, \ldots, a_k \in \mathbb{R}}} \sum_{j=1}^{M} \left\| y_j - \sum_{l=1}^{k} a_l e^{i2\pi f_l t_j} \right\|_2^2,$$

where $\|\ldots\|_2$ denotes "the $L_2$ norm of", and M denotes an integer.

4. The system as set forth in claim 3, wherein $$t_1, t_2, \ldots, t_M \in \left\{0, \frac{1}{N}, \frac{2}{N}, \ldots, \frac{N-1}{N}\right\},$$

and wherein the one or more processors further perform operations of:

defining a matrix $\Phi = DF$, where F is an inverse Fourier matrix and D is a diagonal matrix associated with selection of $t_1, t_2, \ldots, t_M$;

wherein a diagonal of the matrix $\Phi$ is defined by $d(j)=1$ if $j=t_i N$ for some i and $d(j)=0$ otherwise;

approximating a set of non-uniform samples $\vec{y}=(y_1, y_2, \ldots, y_M)$ by $\vec{y} \approx \Phi \vec{x}$, where $\vec{x}=(x_1, x_2, \ldots, x_N)$ with $x_j = \alpha_i$ if $j = \text{round}(f_i)$ for some i and $x_j = 0$ otherwise; and computing a convex optimization problem having a solution according to the following:

$$\vec{x}^* = \operatorname{argmin}_{\vec{x}} \|\vec{y} - \Phi \vec{x}\|_2^2 + \lambda \|\vec{x}\|_1,$$

where $\lambda > 0$ is a tuning parameter.

5. The system as set forth in claim 4, wherein the one or more processors further perform operations of:

identifying a set of indices, I, of k' largest absolute values of $$\vec{x}^* = (x_1^*, x_2^*, \ldots, x_N^*),$$

where $\vec{a}^* = \vec{x}^*(I)$ and $\vec{f}^* = I$;

computing a minimization with respect to $\vec{f}$ according to the following:

$$\min_{f_1, f_2, \ldots, f_{k'} \in [0,N]} \sum_{j=1}^{M} \left\| y_j - \sum_{l=1}^{k'} a_l e^{i2\pi f_l t_j} \right\|_2^2; \text{ and}$$

computing a minimization with respect to $\vec{\alpha}$ according to the following:

$$\min_{a_1, a_2, \ldots, a_{k'} \in \mathbb{R}} \sum_{j=1}^{M} \left\| y_j - \sum_{l=1}^{k'} a_l e^{i2\pi f_l t_j} \right\|_2^2.$$

6. A computer-implemented method for accurately reconstructing analog signals, comprising:

an act of causing a data processor to execute instructions stored on a non-transitory memory such that upon execution, the data processor performs operations of:

receiving an unknown continuous analog signal comprising a set of arbitrary frequencies and a set of arbitrary amplitudes;

obtaining a set of non-uniform samples of the unknown continuous analog signal at a plurality of times; and utilizing an iterative reconstruction process to determine a set of frequencies and a set of amplitudes that best fit the set of non-uniform samples in a global minimum problem in order to accurately reconstruct the continuous analog signal.

7. The method as set forth in claim 6, wherein the data processor further performs operations of:
   in an initial step of the reconstruction process, applying compressive sensing to compute approximations of the set of frequencies and the set of amplitudes; and
   in a subsequent step of the reconstruction process, using the approximations of the set of frequencies and the set of amplitudes to find the minimizations of the set of frequencies and the set of amplitudes.

8. The method as set forth in claim 7, wherein the continuous analog signal, y, is a linear combination of k tones:

$$y(t) = \sum_{l=1}^{k} a_l e^{i2\pi f_l t},$$

where $$f_l \in [0, N], a_l \in \mathbb{R}, \text{ for } t \in \mathbb{R},$$

where $f_l$ denotes an $l^{th}$ frequency, $\alpha_l$ denotes an $l^{th}$ amplitude, t denotes time, N denotes an integer, $\mathbb{R}$ denotes the set of real numbers, $\Sigma$ denotes a summation, $\in$ denotes "is an element of", and $e^{i2\pi f_l t}$ denotes a pure tone;
   wherein the set of non-uniform samples is $y_1 = y(t_1)$, $y_2 = y(t_2)$, ..., $y_M = y(t_M)$, where M<N; and
   wherein the global minimum problem is:

$$\min_{\substack{f_1, f_2, \ldots, f_k \in [0, N] \\ a_1, a_2, \ldots, a_k \in \mathbb{R}}} \sum_{j=1}^{M} \left\| y_j - \sum_{l=1}^{k} a_l e^{i2\pi f_l t_j} \right\|_2^2,$$

where $\|\ldots\|_2$ denotes "the $L_2$ norm of", and M denotes an integer.

9. The method as set forth in claim 8, wherein $$t_1, t_2, \ldots, t_M \in \left\{0, \frac{1}{N}, \frac{2}{N}, \ldots, \frac{N-1}{N}\right\},$$

and wherein the data processor further performs operations of:
   defining a matrix $\Phi = DF$, where F is an inverse Fourier matrix and D is a diagonal matrix associated with selection of $t_1, t_2, \ldots, t_M$;
   wherein a diagonal of the matrix $\Phi$ is defined by $d(j)=1$ if $j=t_iN$ for some i and $d(j)=0$ otherwise;
   approximating a set of non-uniform samples $\vec{y}=(y_1, y_2, \ldots, y_M)$ by $\vec{y} \approx \Phi \vec{x}$, where $\vec{x}=(x_1, x_2, \ldots, x_N)$ with $x_j=\alpha_i$ if $j=\text{round}(f_i)$ for some i and $x_j=0$ otherwise; and
   computing a convex optimization problem having a solution $\vec{x}^*$ according to the following:

$$\vec{x}^* = \operatorname{argmin}_{\vec{x}} \|\vec{y} - \Phi\vec{x}\|_2^2 + \lambda\|\vec{x}\|_1,$$

where $\lambda > 0$ is a tuning parameter.

10. The method as set forth in claim 9, wherein the data processor further performs operations of:
   identifying a set of indices, I, of k' largest absolute values of
   $\vec{x}^* = (x^*_1, x^*_2, \ldots, x^*_N)$,
   where $\vec{\alpha}^* = \vec{x}^*(I)$ and $\vec{f}^* = I$;
   computing a minimization with respect to $\vec{f}$ according to the following:

$$\min_{f_1, f_2, \ldots, f_{k'} \in [0, N]} \sum_{j=1}^{M} \left\| y_j - \sum_{l=1}^{k'} a_l e^{i2\pi f_l t_j} \right\|_2^2; \text{ and}$$

computing a minimization with respect to $\vec{\alpha}$ according to the following:

$$\min_{a_1, a_2, \ldots, a_{k'} \in \mathbb{R}} \sum_{j=1}^{M} \left\| y_j - \sum_{l=1}^{k'} a_l e^{i2\pi f_l t_j} \right\|_2^2.$$

11. A computer program product for accurately reconstructing analog signals, the computer program product comprising computer-readable instructions stored on a non-transitory computer-readable medium that are executable by a computer having a processor for causing the processor to perform operations of:
   receiving an unknown continuous analog signal comprising a set of arbitrary frequencies and a set of arbitrary amplitudes;
   obtaining a set of non-uniform samples of the unknown continuous analog signal at a plurality of times; and
   utilizing an iterative reconstruction process to determine a set of frequencies and a set of amplitudes that best fit the set of non-uniform samples in a global minimum problem in order to accurately reconstruct the continuous analog signal.

12. The computer program product as set forth in claim 11, further comprising instructions for causing the processor to perform operations of:
   in an initial step of the reconstruction process, applying compressive sensing to compute approximations of the set of frequencies and the set of amplitudes; and
   in a subsequent step of the reconstruction process, using the approximations of the set of frequencies and the set of amplitudes to find the minimizations of the set of frequencies and the set of amplitudes.

13. The computer program product as set forth in claim 12, wherein the continuous analog signal, y, is a linear combination of k tones:

$$y(t) = \sum_{l=1}^{k} a_l e^{i2\pi f_l t},$$

where $$f_l \in [0, N], a_l \in \mathbb{R}, \text{ for } t \in \mathbb{R},$$

where $f_l$ denotes an $l^{th}$ frequency, $\alpha_l$ denotes an $l^{th}$ amplitude, t denotes time, N denotes an integer, $\mathbb{R}$ denotes the set of real numbers, $\Sigma$ denotes a summation, $\in$ denotes "is an element of", and $e^{i2\pi f_l t}$ denotes a pure tone;
   wherein the set of non-uniform samples is $y_1 = y(t_1)$, $y_2 = y(t_2)$, ..., $y_M = y(t_M)$, where M<N; and
   wherein the global minimum problem is:

$$\min_{\substack{f_1, f_2, \ldots, f_k \in [0, N] \\ a_1, a_2, \ldots, a_k \in \mathbb{R}}} \sum_{j=1}^{M} \left\| y_j - \sum_{l=1}^{k} a_l e^{i2\pi f_l t_j} \right\|_2^2,$$

where $\|\ldots\|_2$ denotes "the $L_2$ norm of", and M denotes an integer.

14. The computer program product as set forth in claim 13, wherein $t_1, t_2, \ldots, t_M \in$ $$\left\{0, \frac{1}{N}, \frac{2}{N}, \ldots, \frac{N-1}{N}\right\},$$

and further comprising instructions for causing the processor to perform operations of:

defining a matrix $\Phi = DF$, where F is an inverse Fourier matrix and D is a diagonal matrix associated with selection of $t_1, t_2, \ldots, t_M$;

wherein a diagonal of the matrix $\Phi$ is defined by $d(j)=1$ if $j=t_i N$ for some and $d(j)=0$ otherwise;

approximating a set of non-uniform samples $\vec{y}=(y_1, y_2, \ldots, y_M)$ by $\vec{y} \approx \Phi \vec{x}$, where $\vec{x}=(x_1, x_2, \ldots, x_N)$ with $x_j = \alpha_i$ if $j = \text{round}(f_i)$ for some i and $x_j = 0$ otherwise; and computing a convex optimization problem having a solution $\vec{x}^*$ according to the following:

$$\vec{x}^* = \operatorname{argmin}_{\vec{x}} \|\vec{y} - \Phi \vec{x}\|_2^2 + \lambda \|\vec{x}\|_1,$$

where $\lambda > 0$ is a tuning parameter.

15. The computer program product as set forth in claim 14, further comprising instructions for causing the processor to perform operations of:

identifying a set of indices, I, of k' largest absolute values of $\vec{x}^* = (x^*_1, x^*_2, \ldots, x^*_N)$, where $\vec{a}^* = \vec{x}^*(I)$ and $\vec{f}^* = I$;

computing a minimization with respect to $\vec{f}$ according to the following:

$$\min_{f_1, f_2, \ldots, f_{k'} \in [0,N]} \sum_{j=1}^{M} \left\| y_j - \sum_{l=1}^{k'} a_l e^{i 2\pi f_l t_j} \right\|_2^2 ;$$

and computing a minimization with respect to $\vec{\alpha}$ according to the following:

$$\min_{a_1, a_2, \ldots, a_{k'} \in \mathbb{R}} \sum_{j=1}^{M} \left\| y_j - \sum_{l=1}^{k'} a_l e^{i 2\pi f_l t_j} \right\|_2^2 .$$

* * * * *